(12) United States Patent
Yamada et al.

(10) Patent No.: US 7,084,463 B2
(45) Date of Patent: Aug. 1, 2006

(54) SEMICONDUCTOR DEVICE AND MANUFACTURING METHOD THEREOF

(75) Inventors: Junji Yamada, Gunma (JP); Yutaka Yamada, Gunma (JP); Junichi Ariyoshi, Mie (JP)

(73) Assignee: Sanyo Electric Co., Ltd. (JP)

( * ) Notice: Subject to any disclaimer, the term of this patent is extended or adjusted under 35 U.S.C. 154(b) by 250 days.

(21) Appl. No.: 10/094,846

(22) Filed: Mar. 11, 2002

(65) Prior Publication Data

US 2002/0130423 A1 Sep. 19, 2002

(30) Foreign Application Priority Data

Mar. 13, 2001 (JP) ............... P. 2001-069940
Apr. 11, 2001 (JP) ............... P. 2001-112351

(51) Int. Cl.
*H01L 31/119* (2006.01)
(52) U.S. Cl. ..................... 257/368; 257/758
(58) Field of Classification Search ........ 257/390, 257/391, 392, 295, 296, 327, 368, 758; 438/128, 438/129, 130, 275, 278, 290
See application file for complete search history.

(56) References Cited

U.S. PATENT DOCUMENTS

| | | | | |
|---|---|---|---|---|
| 5,218,568 A | * | 6/1993 | Lin et al. .................... 257/314 |
| 5,378,649 A | * | 1/1995 | Huang ........................ 438/278 |
| 5,772,906 A | * | 6/1998 | Abraham .................... 438/714 |
| 5,828,097 A | * | 10/1998 | Tanigawa .................... 257/306 |
| 5,874,359 A | * | 2/1999 | Liaw et al. ................ 438/640 |
| 5,937,323 A | * | 8/1999 | Orczyk et al. ............. 438/624 |
| 6,133,143 A | * | 10/2000 | Lin et al. ..................... 438/627 |
| 6,326,269 B1 | * | 12/2001 | Jeng et al. ................... 438/278 |
| 6,380,066 B1 | * | 4/2002 | See et al. ................... 438/624 |
| 6,518,594 B1 | * | 2/2003 | Nakajima et al. ............ 257/59 |

FOREIGN PATENT DOCUMENTS

| | | |
|---|---|---|
| JP | WO97/22995 | 6/1997 |
| JP | A-10-12734 | 1/1998 |
| JP | A-11-111862 | 4/1999 |
| JP | 11-233651 | 8/1999 |
| KR | 1998-14818 | 5/1998 |
| KR | 1999-05866 | 1/1999 |

* cited by examiner

*Primary Examiner*—Douglas W Owens
(74) *Attorney, Agent, or Firm*—Fish & Richardson P.C.

(57) ABSTRACT

A semiconductor device includes: a gate electrode on a semiconductor substrate through a gate insulated film; source/drain regions to be adjacent to said gate electrode; and an Al wiring through an interlayer insulating film covering said gate electrode, wherein impurity ions are implanted into a surface of said semiconductor substrate using as a mask said Al wiring, and a protection film is formed on the Al wiring so that the Al wiring is not exposed when said interlayer insulating film is etched.

4 Claims, 11 Drawing Sheets

FIG.9A -- PRIOR ART --
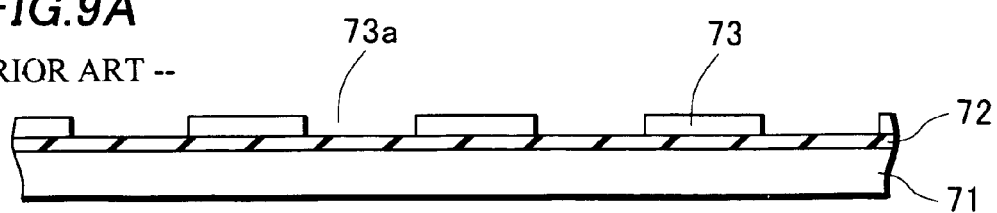
FIG.9B -- PRIOR ART --
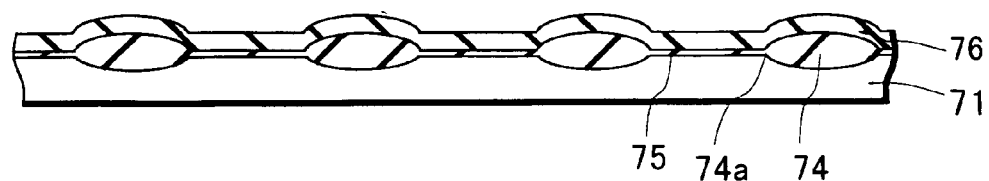
FIG.9C -- PRIOR ART --
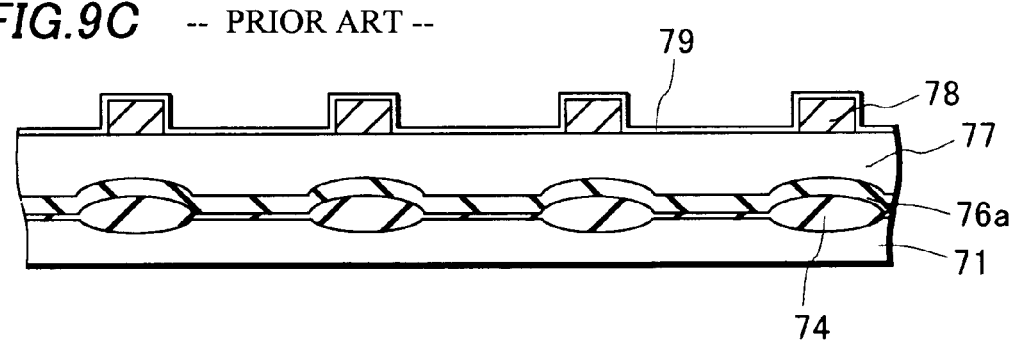
FIG.9D -- PRIOR ART --
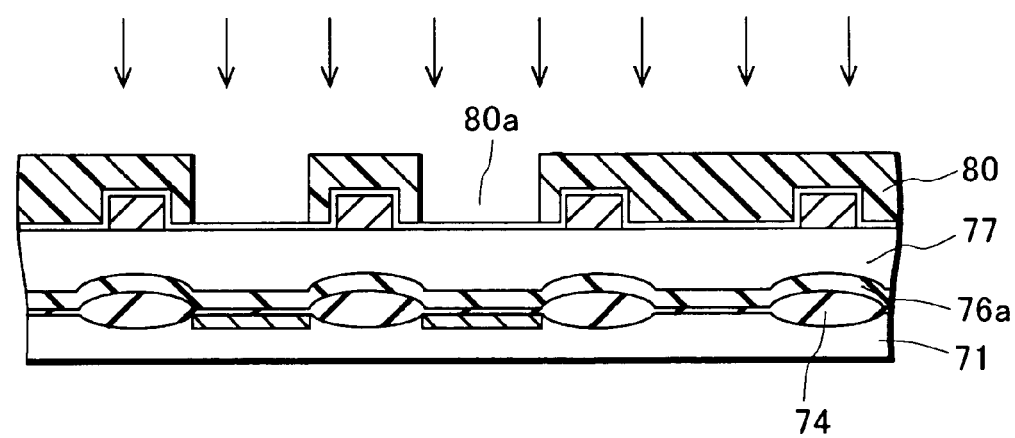

SEMICONDUCTOR DEVICE AND MANUFACTURING METHOD THEREOF

BACKGROUND OF THE INVENTION

This invention relates to a method of manufacturing a semiconductor device, and more particularly to a manufacturing technique of stabilizing an operation of writing information into each of elements which constitute a mask ROM (Read Only Memory).

In order to shorten the TAT (Turn Around Time) of a mask ROM, various techniques of ion-implanting for writing information (which is also referred to as "program write" or "ROM write") after an Al wiring has been formed are known. Referring to FIGS. 9A to 9D, an explanation will be given of a conventional manufacturing technique.

Step 1: As seen from FIG. 9A, using the technique of thermal oxidation or CVD, a pad oxide film 72 of a silicon oxide film having a thickness of 25 nm is formed on a P-type semiconductor substrate 71. The pad oxide film 72 is formed to protect the surface of the semiconductor substrate 71.

Next, a silicon nitride film 73 which is an oxidation-resistant film is formed on the entire surface. Thereafter, lengthy stripes of openings 73a for forming element isolation films 74 are formed in the silicon nitride film 73 in a direction perpendicular to a paper face of this drawing.

Step 2: As seen from FIG. 9B, using the technique of LOCOS with the silicon nitride film 73 as a mask, the semiconductor substrate 71 is oxidized to form element isolation films 74. At this time, oxide regions invades between the semiconductor substrate 71 and silicon nitride film 73 so that bird's beaks 74a are formed. Next, the silicon nitride film 73 and pad oxide film 72 are removed, and using the technique of thermal oxidation, a gate insulated film 75 having a thickness of 14 nm to 17 nm is formed. Using the technique of CVD, a poly-Si film having a thickness of 350 nm is formed, and phosphorus is doped to form an N-type conductive film 76.

Step 3: As seen from FIG. 9C, the conductive film 76 is etched in lengthy strips in a direction orthogonal to the element isolation films 74 (it should be noted that the etched region, which is in parallel to the paper face, is not illustrated) to form gate electrodes 76a which serve as word lines. Using the gate electrodes 76a as a mask, P-type impurities such as boron are ion-implanted to form a source region and a drain region (which are not illustrated since they are formed below both ends of the gate electrode in a direction perpendicular to the paper face).

Through the process described above, memory cell transistors arranged in a matrix shape are formed. An interlayer insulating film 77 having a thickness of 500 nm of a silicon oxide film is formed on the entire surface. Al wirings 78 in lengthy strips, which serve as bit lines, are formed above the element isolation films 74, respectively in a direction perpendicular to the paper face. Until this step, the manufacturing process can be carried out irrespectively of what program should be written in the memory cell transistors. For this reason, the wafers can be previously manufactured. In this case, a silicon oxide film 79 serving as a protection film is formed on the entire surface.

Step 4: At the time when a program to be written is determined on receipt of a request from a customer, as seen from FIG. 9D, a photoresist 80 having openings 80a for writing a program for a mask ROM is formed. P type impurities such as boron are ion-implanted in the semiconductor substrate 71 immediately beneath the gate electrodes 76a from the openings 80a so that predetermined memory cell transistors are depleted. Thus, the threshold voltages of the memory cell transistors are lowered so that a ROM data is written.

However, generally, the processing accuracy of the photoresist is low, e.g. 0.5 µm. Therefore, the openings 80a formed in the photoresist 80 provide a variation of 0.5 µm. Further, as described above, the element isolation film 54 has the bird's beak and hence is thinned at its end. Therefore, where there is a variation in the openings 80a, as seen from FIG. 10, as the case may be, implanted impurity ions penetrate the bird's beak 74a to reach the semiconductor substrate 71 beneath the element isolation film 74, surrounded by circle A. Where such elements are adjacent to each other, a leak current flowing below the element isolation film 74, as indicated by arrow, occurs between the adjacent elements. This leads to poor element isolation. The improvement of the processing accuracy of the photoresist mask leads to a great increase in cost.

Further, in the semiconductor device incorporating various transistors having different withstand voltages, the thickness of the gate insulated film is set according to the various transistors. For example, where the gate insulated films having two kinds of film thicknesses are to be formed, a thick gate insulated film is once formed on the entire surface, and is etched at the area(s) where a thin gate insulated film is to be formed, and further the thin gate insulated film is formed again.

In this case, when the thick gate insulated film is etched away, the element isolation film will be shaved. During such a process, the thickness of the element isolation film at an ROM part gradually becomes thin.

In the process in which the ROM will be made later, ion-implantation for data write is executed to penetrate an interlayer insulating film, gate electrode and gate insulated film. Therefore, this must be carried out at high energy of 1 MeV to 3 MeV. The ion implantation at such high energy increases the lateral diffusion of implanted ions. This also leads to the poor element isolation as described.

Further, the apparatus for executing ion-implantation at such high energy is generally expensive, which results in an increase in cost.

For the reasons described above, in order to prevent the poor element isolation, the element isolation film must be set in a width larger than a processing limit so as to give sufficient allowance. In addition, it is difficult to thin the element isolation film, which hinders miniaturization.

In order to overcome such an inconvenience, the above technique of writing information is carried out using as a mask the metallic film (Al wiring) with higher accuracy than the photoresist.

Referring to FIG. 11, the problem in the process using such a metallic film as a mask will be explained. FIG. 11 illustrates a semiconductor device having a multiplayer wiring structure including Al wirings 78, 82 and 84.

When interlayer insulating films are etched using the photoresist (not shown) as a mask, an Al wiring 78 also serves as a mask. Therefore, as seen from FIG. 11, a part of an interlayer insulating film 77 as well as the interlayer insulating films 85, 83 and 81 on the Al wiring 78 is etched. At this time, the Al wiring 78 itself is also etched slightly. Thus, a deposit 86 is formed on the side wall of an opening 85a. As a result of analysis, it was found that the deposit 86 contains an etching gas (e.g. $BCl_3$), carbon (C) contained in the photoresist and metallic wiring (Al), etc.

Owing to the presence of the deposit 86 on the side wall, the coverage when a passivation film 87 is deposited deteriorates (area surrounded by circle B in FIG. 11). This presents a problem in reliability such as occurrence of pin holes, attenuation of moisture resistance, etc. In addition, the sectional area of the Al wiring is also reduced so that the life of electromigration also attenuates. This is the first problem.

Further, in the process of writing information using the Al wiring as a mask, in many cases, a flattened interlayer insulating film is formed on the Al wiring 78. The flattened interlayer insulating film can be formed as shown in FIG. 12A, i.e. in such a manner that after a silicon oxide film 91 and spin-on-glass film (hereinafter referred to as SOG film) 92 have been formed, the SOG film 92 is etched back, and a silicon oxide film 93 is formed.

In this process, if a wide Al wiring 78A (having a width e.g. 15 μm or more) exists on the periphery of a random logic section and memory section, under the influence of the wide Al wiring 78A, the SOG film 92 becomes excessively thick on the periphery.

Thus, when the region to be information-written is etched to form an opening, as seen from FIG. 12B, an etching remainder 95 occurs because of the SOG film 92 thickened excessively. As a result, the diameter of the opening for writing information in the via hole or the ROM section runs short, thereby lowering the yield.

It is possible to suppress occurrence of the etching remainder by lengthening the etching quantity (time). However, in this case, the Al wiring itself serving as a mask is somewhat etched. In this case, although the deposit is formed on the side wall of the opening, it is not problematic as long as the etching quantity is set appropriately. However, in order to suppress the etching remainder, if an excessive etching quantity (time) is set, the deposit on the sidewall has an adverse effect. Owing to the presence of the deposit on the sidewall, the coverage when a passivation film is deposited deteriorates. This presents a problem in reliability such as occurrence of pin holes, attenuation of moisture resistance, etc. In addition, the sectional area of the Al wiring is also reduced so that the life of electromigration also attenuates.

For this reason, in order to suppress the occurrence of the etching remainder, the etching quantity (time) cannot be lengthened excessively. This is a second problem.

SUMMARY OF THE INVENTION

In view of the first problem, the semiconductor device according to this invention comprises: a gate electrode on a semiconductor substrate through a gate insulated film; source/drain regions to be adjacent to said gate electrode; and a metallic wiring through an interlayer insulating film covering said gate electrode, wherein impurity ions are implanted into a surface of said semiconductor substrate with said interlayer insulating film being partially etched using as a mask said metallic wiring and a photoresist formed thereon, and a protection film when said interlayer has been etched is formed on said metallic wiring.

Preferably, said protection film is a titanium film or a laminated film including the titanium film and a titanium nitride film.

The method of manufacturing a semiconductor device according to this invention has a feature that said interlayer insulating film is etched so that a surface of said metallic wiring is not exposed using a protection film formed on said metallic film.

The method of manufacturing a semiconductor device has features that said metallic wiring is formed in a multiplayer wiring structure, and the impurity ions are implanted using the metallic wiring as a mask in a state where said interlayer insulating film has been etched using a photoresist as a mask so that the surface of said metallic wiring is not exposed using a protection film formed on said metallic film at a lowermost layer.

The method of manufacturing a semiconductor device has a feature that the impurity ions are implanted to write information in each of elements which constitute a mask ROM.

In the above configurations, when the interlayer insulating film is etched using the metallic film as a mask, it is etched so that said metallic wiring is not exposed using a protection film formed on said metallic film. For this reason, it is possible to prevent a deposit from being formed on the side wall of the opening of the interlayer insulating film.

In view of the second problem, the semiconductor device according to this invention comprises: a gate electrode on a semiconductor substrate through a gate insulated film; source/drain regions to be adjacent to said gate electrode; a narrow metallic wiring and a wide metallic wiring through an lower interlayer insulating film covering said gate electrode; and an upper interlayer insulating film formed to cover said metallic wirings and flattened; wherein impurity ions are implanted into a surface of said semiconductor substrate with said interlayer insulating films being etched by a prescribed amount using as a mask said metallic wirings and a photoresist formed thereabove, and a groove is formed in a surface of said wide metallic wiring.

Preferably, slits are formed at regular intervals so as to subdivide said wide metallic wiring.

The method of manufacturing a semiconductor device according to this invention comprises the step of forming said upper interlayer insulating film so that a flattened film is embedded in a groove formed in a surface of said wide metallic wiring.

The method of manufacturing a semiconductor device has a feature that said overlying insulating film is formed so that said flattened film is embedded in said slits formed at regular intervals to subdivide said wide metallic wiring.

The method of manufacturing a semiconductor device has a feature that the impurity ions are implanted to write information in each of elements which constitute a mask ROM.

In this configurations, the flattened film is embedded in the groove or slits so that it is not formed excessively thick on the periphery of the wide metallic wiring. For this reason, shortage of the opening due to the etching remainder can be suppressed.

BRIEF DESCRIPTION OF THE DRAWINGS

FIGS. 9A to 9D are sectional views for explaining a method of manufacturing a conventional semiconductor device;

DETAILED DESCRIPTION OF THE PREFERRED EMBODIMENT

Figure 1A:
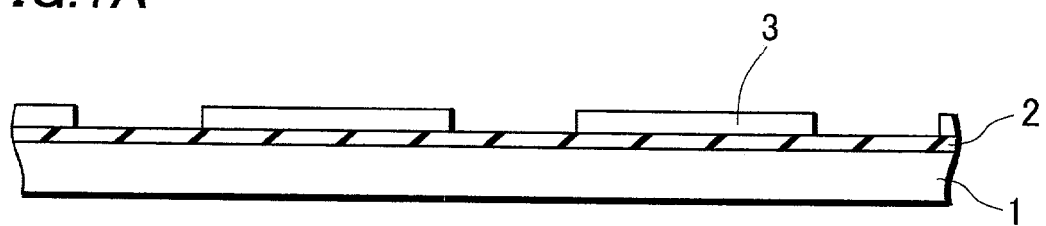
FIGS. 1A to 1C are sectional views for explaining a method of manufacturing a semiconductor device according to a first embodiment of this invention.

Now referring to the drawings, preferred embodiments of the invention will be described below.

Embodiment 1

Step 1: As seen from FIG. 1A, like the step 1 in the conventional manufacturing process, a pad oxide film 2 is formed on a P-type semiconductor substrate 1 and a silicon nitride film 3 having openings is formed.

Figure 1B:
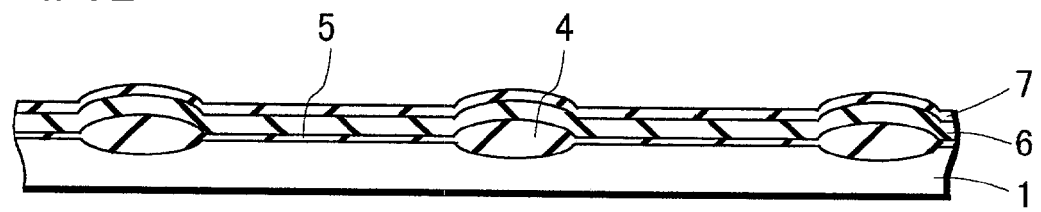

Step 2: As seen from FIG. 1B, using the technique of LOCOS with the silicon nitride film 3 as a mask, the semiconductor substrate 1 is oxidized to form element isolation films 4.

Next, the pad oxide film 2 and the silicon nitride film 3 are removed, and using the technique of thermal oxidation, a gate insulated film 5 having a thickness of 14 nm to 17 nm is formed. Using the technique of CVD, a poly-Si film having a thickness of 100 nm is formed, and phosphorus is doped to form an N-type conductive film 6.

A silicide film 7 of refractory metal such as tungsten having a thickness of 150 nm is formed. The silicide film 7 as well as the conductive film 6 constitutes a gate electrode, and serves to reduce the electric resistance of the gate electrode and protect the gate electrode as described later.

Figure 1C:
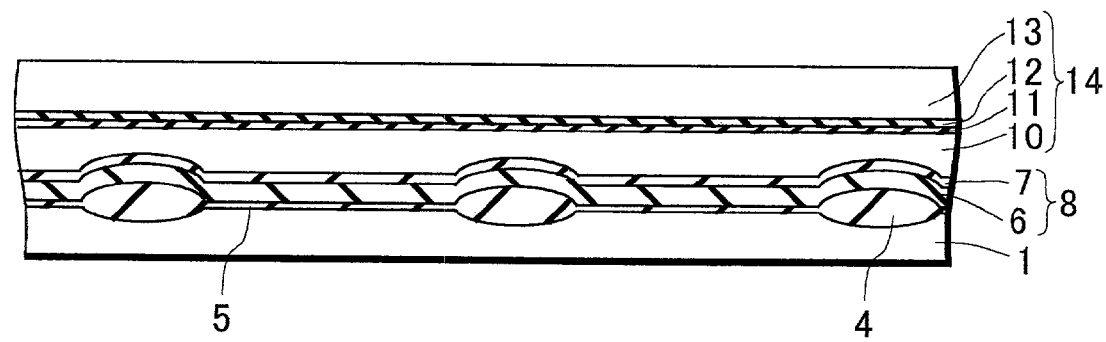

Step 3: As seen from FIG. 1C, the conductive film 6 and silicide film 7 are etched in lengthy strips in a direction orthogonal to the element isolation films 4 (it should be noted that the etched region, which is in parallel to the paper face, is not illustrated) to form gate electrodes 8 which serve as word lines.

Using the gate electrodes 8 as a mask, P-type impurities such as boron are ion-implanted to form a source region and a drain region (which are not illustrated since they are formed below both ends of the gate electrode in a direction perpendicular to the paper face).

Through the process described above, memory cell transistors arranged in a matrix shape are formed.

By the technique of CVD, an interlayer insulating film 14, which includes a silicon oxide film 10, a silicon nitride film 11, a poly-Si film 12 and a silicon oxide film 13, and has a thickness of 600 nm, is formed on the entire surface. The poly-Si film 12 serves as an etching stopper when the interlayer insulating film 14 is etched as described later.

Figure 2A:
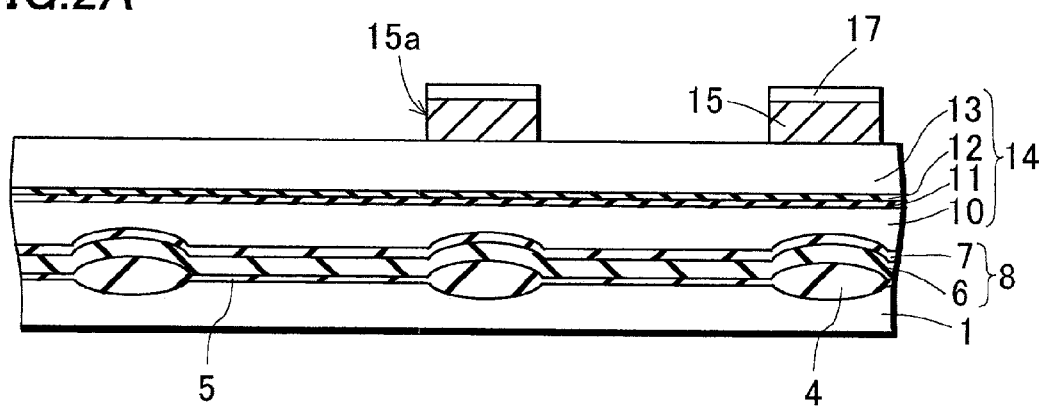
FIGS. 2A and 2B are sectional views for explaining a method of manufacturing a semiconductor device according to the first embodiment of this invention.

Step 4: As seen from FIG. 2A, a metallic film of an Al film is formed on the interlayer insulating film 14. The metallic film is patterned to form Al wirings 15 which serve as bit lines.

Figure 11:
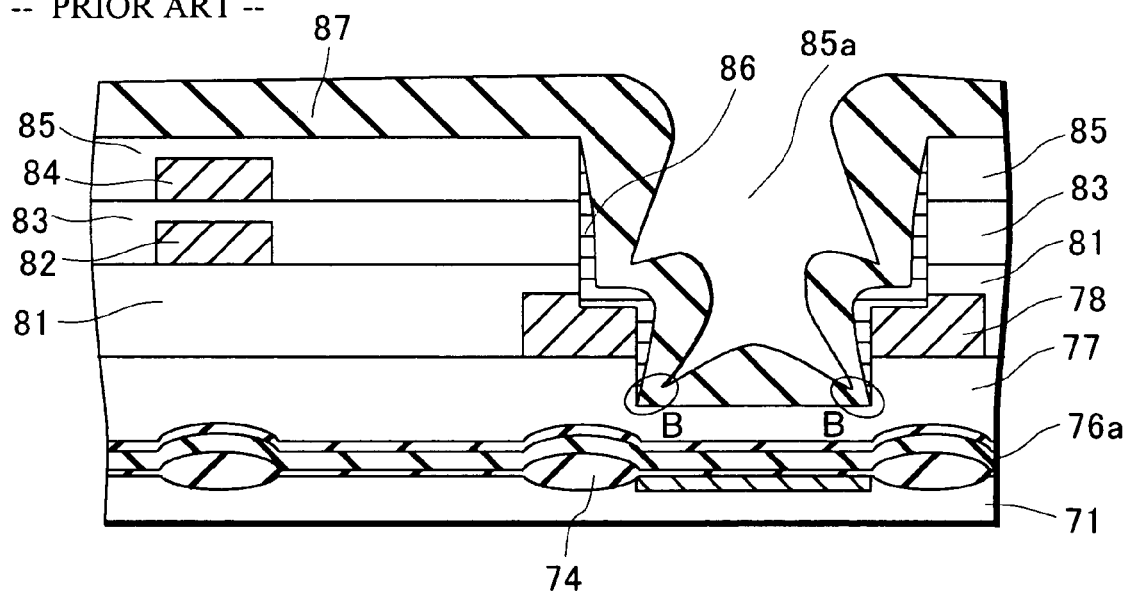
FIG. 11 is a sectional view for explaining the first problem in the conventional semiconductor device.
Figure 12A:
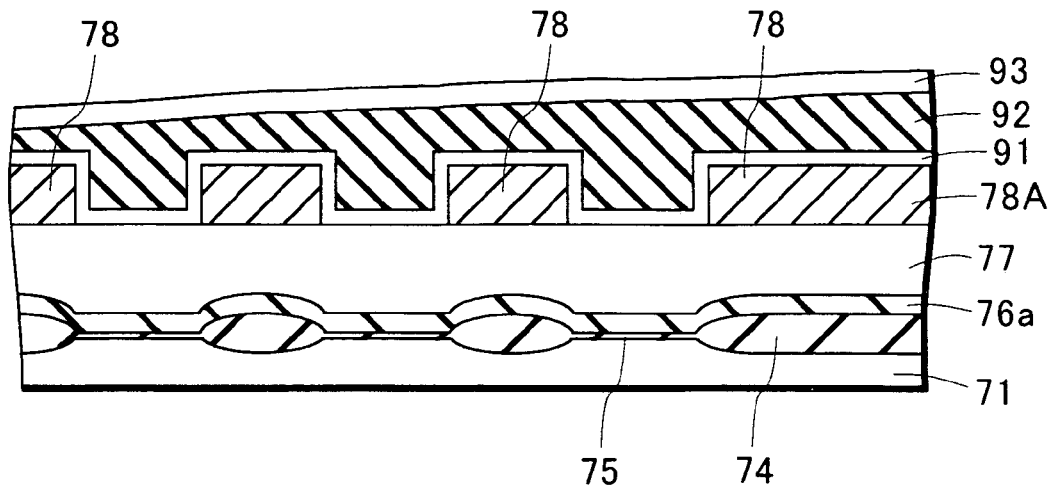
FIGS. 12A and 12B are sectional views for explaining the second problem in the conventional semiconductor device.
Figure 12B:
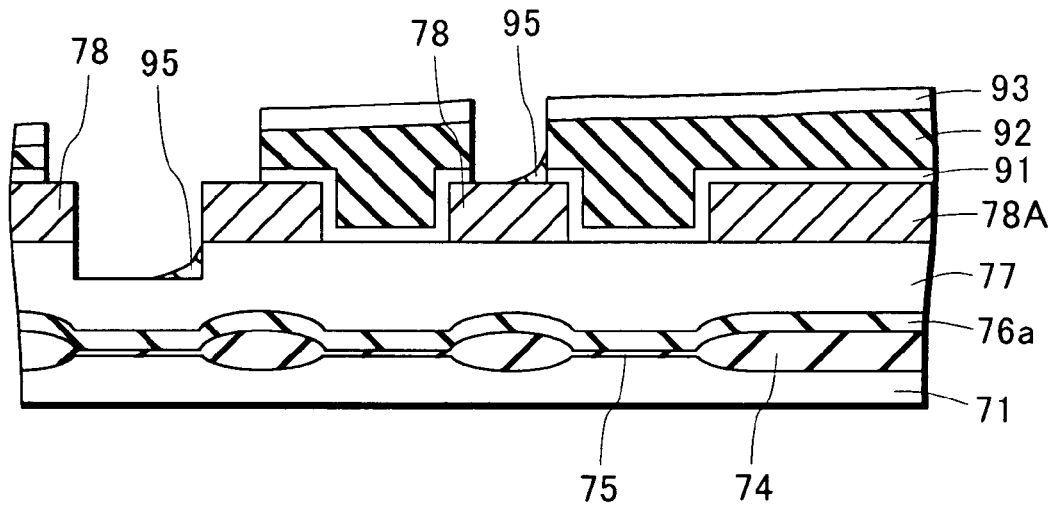

This step is a step which is a feature of this invention. First, the metallic film of an Al film having a thickness of 500 nm is formed on the interlayer insulating film 14. Next, a titanium film having a thickness of 70 nm is formed on the metallic film. A titanium nitride film having a thickness of 35 nm is formed thereon to constitute a protection film. These films are patterned to form the Al wirings 15 which serve as the bit lines. In this way, in accordance with this invention, since the protection film 17 is formed on the Al wiring 15, when the interlayer insulating film is etched using the Al wiring 15 as a mask as described later, the Al wiring 15 is not etched because of the presence of the protection film 17. Therefore, unlike the background art, the deposit 86 is not formed on the side wall of the opening 85a of the interlayer insulating film (see FIG. 11).

It should be noted that the Al wiring 15 is formed so that its edges 15a are located immediately above those of the element isolation film 4. Incidentally, the Al wirings 15 may be a composite film including the metallic film and an titanium film having a thickness of 20 nm and a barrier metal film of a titanium nitride film having a thickness of 35 nm which underlie the metallic film.

In this way, in accordance with this invention, since at least the protection film 17, which generally has a thickness (70 nm) sufficiently larger than that (20 nm) of the titanium film which is used as the above barrier metal film, is formed on the Al wiring 15, the protection film 17 serves as an etching stopper when the interlayer insulating film is etched using the Al wiring 15 as a mask. Incidentally, the thickness of the titanium film can be optionally set according to the etching quantity of the interlayer insulating film.

Figure 2B:
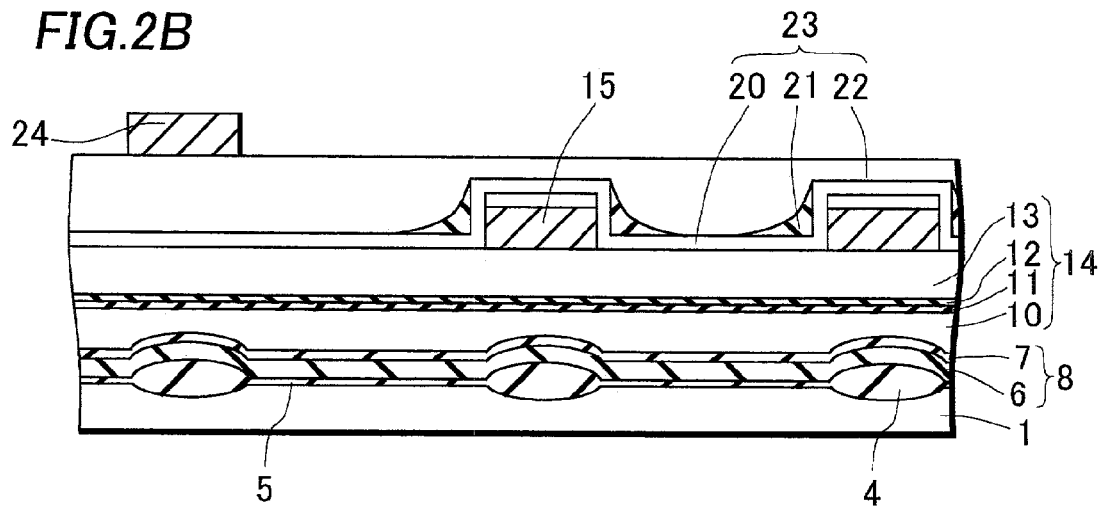

Step 5: As seen from FIG. 2B, a second interlayer insulating film 23 having a thickness of 600 nm and including three layers: a silicon oxide film 20, an SOG film 21 and another silicon oxide film 22 is formed on the entire surface for flattening the surface. A metallic wiring such as an Al wiring is formed on the interlayer insulating film 23. The metallic film is patterned to form a second Al wiring 24.

Figure 3A:
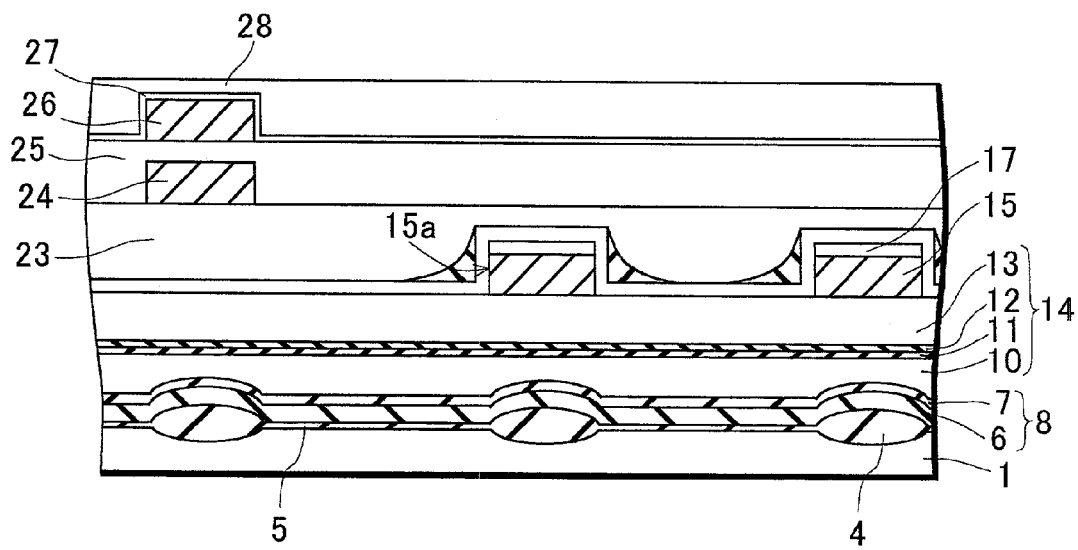
FIGS. 3A and 3B are sectional views for explaining a method of manufacturing a semiconductor device according to the first embodiment of this invention.

Step 6: As seen from FIG. 3A, a third interlayer insulating film 25 having a thickness of 600 nm is formed on the entire surface so as to cover the second Al wiring 24. A metallic wiring of an Al wiring is formed on the interlayer insulating film 25. The metallic wiring thus formed is patterned to form a third wiring 26.

Until this step, the manufacturing process can be carried out irrespectively of what program should be written in the memory cell transistors. For this reason, the wafers can be previously manufactured. In this case, in order to protect the metallic wiring layer and prevent its corrosion, a protection film 27 of e.g. a thin silicon oxide film having a thickness of 50 nm is formed on the entire surface.

Figure 3B:
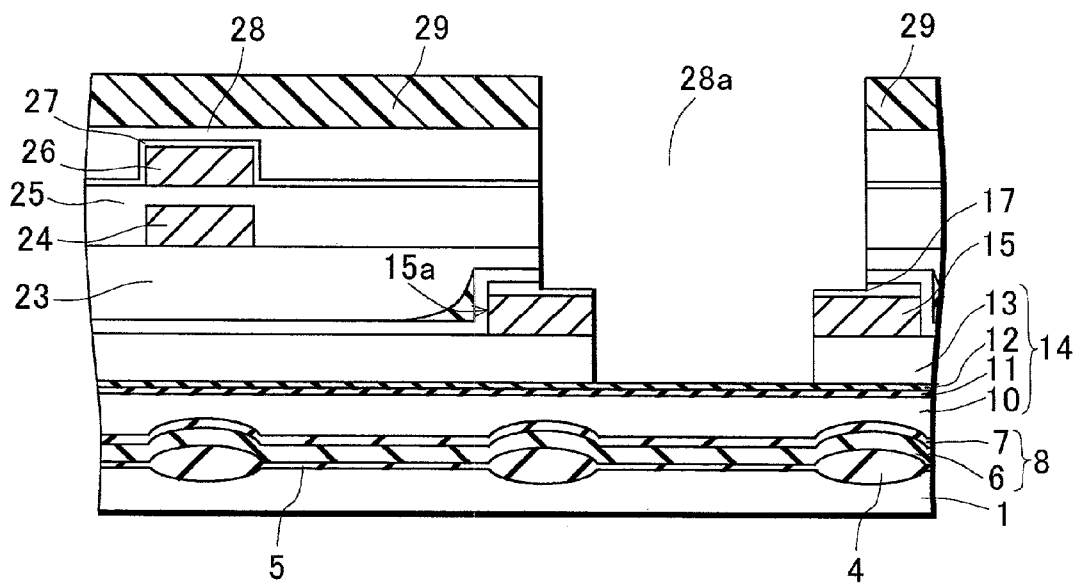

Step 7: At the time when a program to be written is determined on receipt of a request from a customer, a photoresist 29 is formed on the fourth interlayer insulating film 28 formed on the entire surface. Thereafter, using the photoresist 29 as a mask, the interlayer insulating films are etched to make an opening 28a in the region above a prescribed memory cell to be program-written. Incidentally, it should be noted that the etching is stopped on the poly-Si film 12 (FIG. 3B).

In this etching process, since the protection film 17 has been formed on the Al wiring 15 as described above, unlike the background art, the Al wiring 15 itself is not etched and hence no deposit is formed on the side wall of the opening 28a. For this reason, the coverage when a passivation film is formed as described later is improved. As a result, occurrence of pin holes is suppressed and moisture resistance is improved so that the problem in reliability can be solved. In addition, since the sectional area of the Al wiring is not reduced, attenuation in the life of electromigration can be suppressed.

The above suppression of occurrence of the deposit permits a contact resistance to be stabilized.

Further, by making the protection film 17 as a laminate film including a titanium film and a titanium nitride film, the etching of the Al wiring 15 is prevented. Such a laminate film is also effective as a measure against a silicon nodule and as an anti-reflection film.

Incidentally, in this embodiment, the protection film 17 should not be limited to the titanium film used in this embodiment, but may be made of any material as long as it has higher selectivity for the interlayer insulating film than the Al wiring.

Figure 4A:
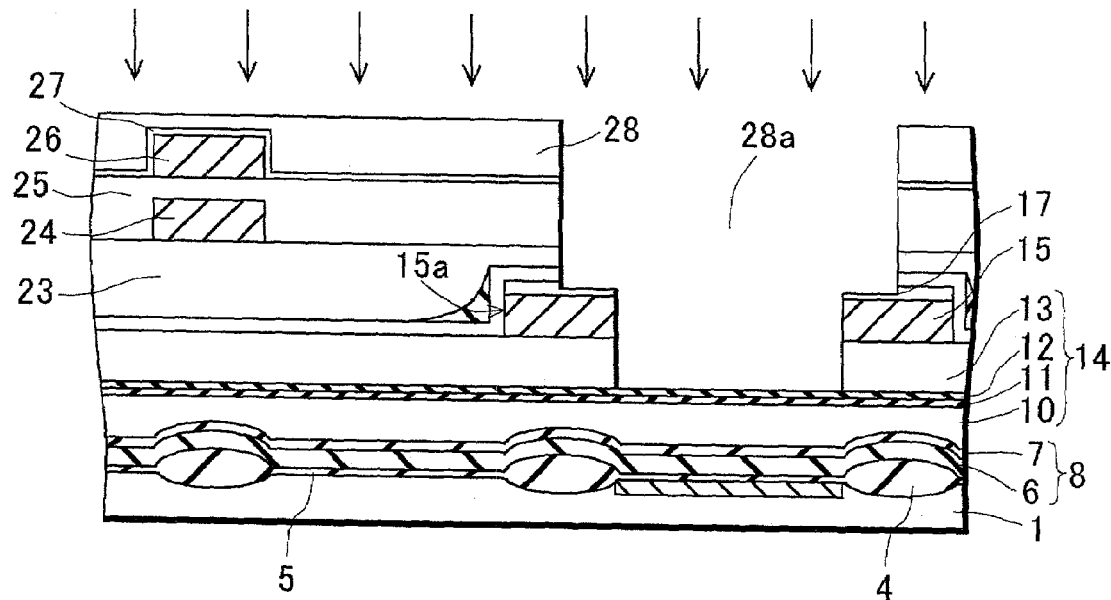
FIGS. 4A and 4B are sectional views for explaining a method of manufacturing a semiconductor device according to the first embodiment of this invention.

Further, as seen from FIG. 4A, P type impurities such as boron are ion-implanted in the semiconductor substrate 1 immediately beneath the gate electrode 8 from the opening 28a so that predetermined memory cell transistor is depleted. As described above, since the edges 15a of the Al wiring 15 are located immediately above those of the element isolation film 4, using the Al wiring as a mask, the ion implantation can be carried out with great accuracy. Thus, the threshold voltage of the memory cell transistor is lowered so that a ROM data is written.

In addition, in accordance with this invention, in the write of the ROM data, since the metallic film (Al wiring 15) having higher processing accuracy than the conventional photoresist, unlike the background art, it is not necessary to give sufficient allowance in order to avoid occurrence of poor element isolation and to give the element isolation film a larger width than the processing limit. This permits microstructuring. Incidentally, the processing accuracy of the photoresist is e.g. 0.5 μm, whereas the processing accuracy of the metal film is e.g. 0.1 μm.

Since a part of the interlayer insulating film 14 as well as the interlayer insulating films 23, 25 and 28 on the Al wiring has been etched, the ion-implanting can be carried out at low energy of 130 keV to 160 keV. This prevents the lateral diffusion of implanted ions, and hence permits the ion-implanting with higher accuracy.

Figure 4B:
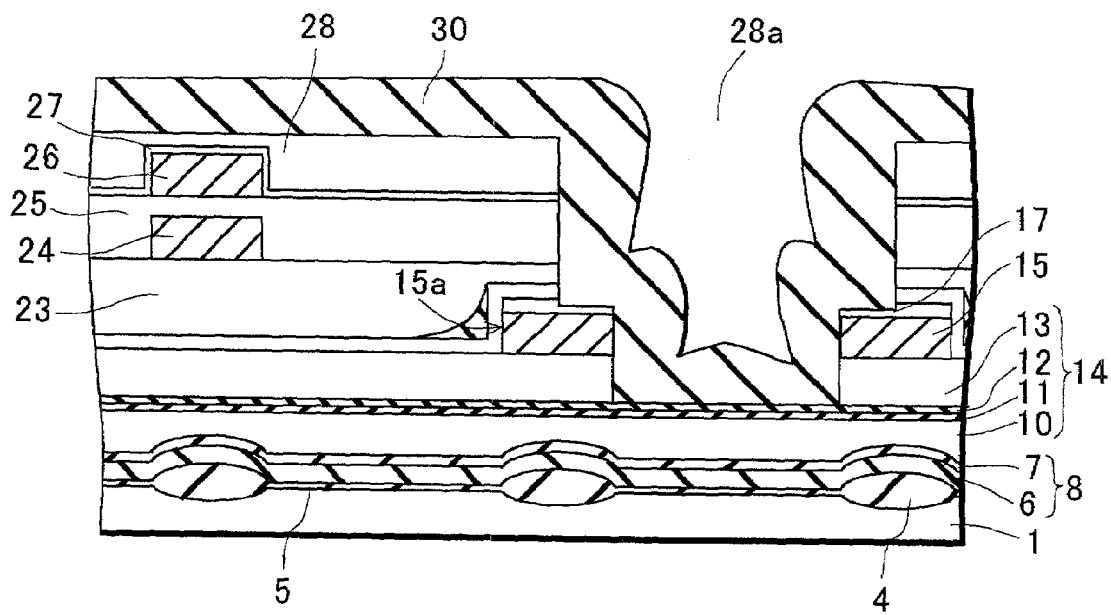

Step 8: As seen from FIG. 4B, a passivation film 30 is formed on the entire surface. Thus, a mask ROM with a desired program written is completed. In this case, since the protection film 17 has been formed on the Al wiring 15, when the interlayer insulating films are etched using the Al wiring 15 as a mask, the Al wiring 15 itself is not etched so that no deposit is formed on the side wall of the opening 28a. For this reason, the coverage of the passivation film 31 will not deteriorate.

Embodiment 2

Now referring to the drawings, an explanation will be given of a second embodiment of this invention.

Figure 5A:
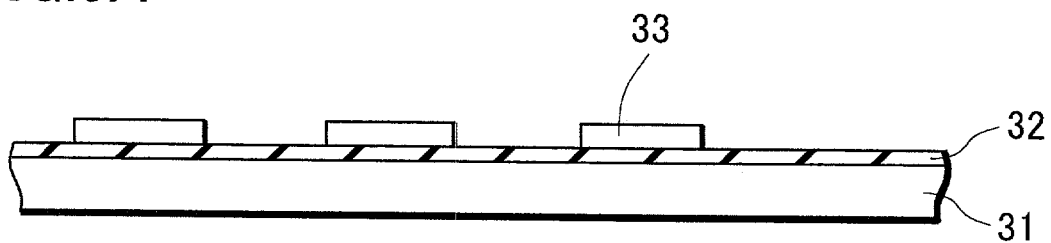
FIGS. 5A to 5C are sectional views for explaining a method of manufacturing a semiconductor device according to a second embodiment of this invention.

Step 1: As seen from FIG. 5A, like the step 1 in the conventional manufacturing process and step 1 in the manufacturing process in the first embodiment, a pad oxide film 32 is formed on a P-type semiconductor substrate 1 and a silicon nitride film 33 having openings is formed.

Figure 5B:
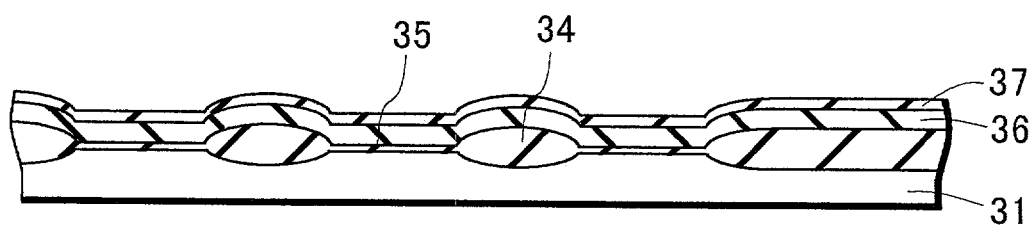

Step 2: As seen from FIG. 5B, using the technique of LOCOS with the silicon nitride film 33 as a mask, the semiconductor substrate 31 is oxidized to form element isolation films 34.

Next, the pad oxide film 32 and the silicon nitride film 33 are removed, and using the technique of thermal oxidation, a gate insulated film 35 having a thickness of 14 nm to 17 nm is formed. Using the technique of CVD, a poly-Si film having a thickness of 100 nm is formed, and phosphorus is doped to form an N-type conductive film 36.

A silicide film 37 of refractory metal such as tungsten having a thickness of 150 nm is formed. The silicide film 37 as well as the conductive film 36 constitutes a gate electrode, and serves to reduce the electric resistance of the gate electrode and protect it as described later.

Step 3: As seen from FIG. 5C, the conductive film 6 and silicide film 7 are etched in lengthy strips in a direction orthogonal to the element isolation films 34 (it should be noted that the etched region, which is in parallel to the paper face, is not illustrated) to form gate electrodes 38 which serve as word lines.

Using the gate electrodes 38 as a mask, P-type impurities such as boron are ion-implanted to form a source region and a drain region (which are not illustrated since they are formed below both ends of the gate electrode in a direction perpendicular to the paper face).

Through the process described above, memory cell transistors arranged in a matrix shape are formed.

By the technique of CVD, a first interlayer insulating film 44, which includes a silicon oxide film 40, a silicon nitride film 41, a poly-Si film 42 and a silicon oxide film 43, and has a thickness of 600 nm, is formed on the entire surface. The poly-Si film 42 serves as an etching stopper when the interlayer insulating film 14 is etched as described later.

Figure 6A:
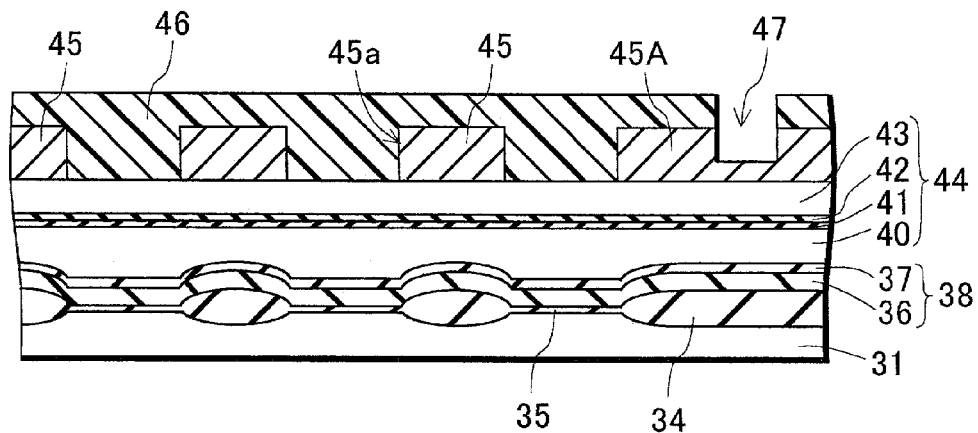
FIGS. 6A to 6C are sectional views for explaining a method of manufacturing a semiconductor device according to the second embodiment of this invention.

Step 4: As seen from FIG. 6A, a metallic film of e.g. an Al film is formed on the interlayer insulating film 44. The metallic film is patterned to form first Al wirings 45 which serve as bit lines.

This step is a step which is a feature of this invention. Specifically, first, a metallic film of e.g. an Al film having a thickness of 500 nm is formed on the interlayer insulating film 44. Using a photoresist not shown as a mask, the metallic film is patterned to Al wirings 45 which serve as bit lines and a wide Al wiring 45A (having a width of e.g. 15 μm or more) on the periphery of a random logic section and memory section. Using a photoresist 46 as a mask, the Al wirings are patterned to form a groove 47 having a prescribed depth in the surface of the Al wiring 45A. Incidentally, although only one groove 47 is illustrated, actually, these grooves are formed at regular intervals according to the size of the wide Al wiring 45A.

It should be noted that the Al wiring 45 is formed so that its edges are located immediately above those of the element isolation film 34. Incidentally, the Al wirings 45 and 45A may be a composite film including the metallic film and an titanium film having a thickness of 20 nm and a barrier metal film of a titanium nitride film having a thickness of 35 nm which underlie the metallic film.

Figure 6B:
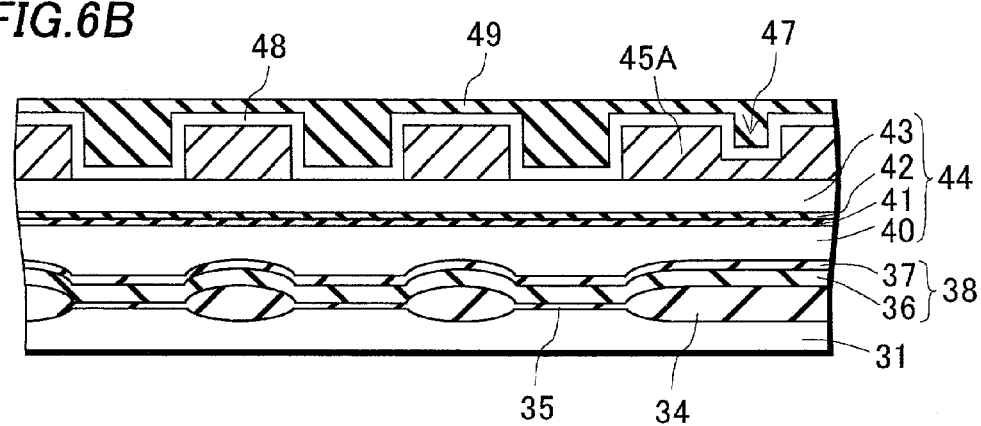
Figure 6C:
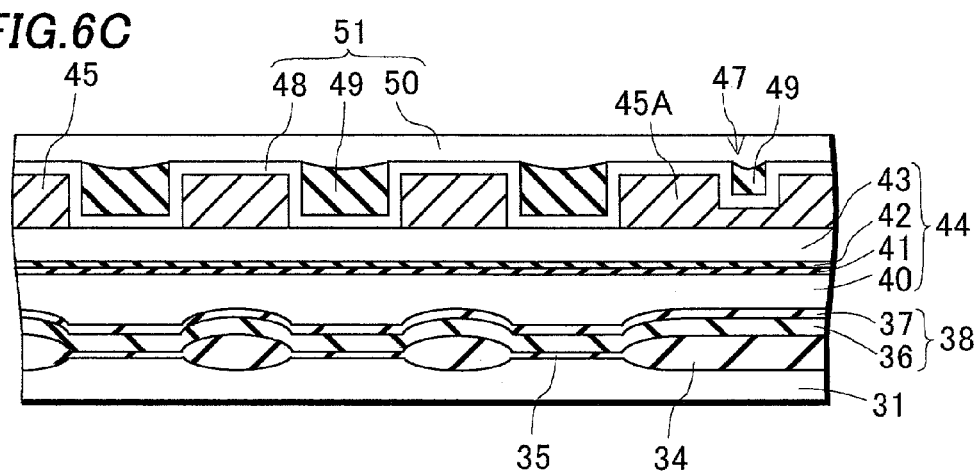

Step 5: As seen from FIG. 6B, a silicon oxide film 48 is formed on the entire surface, and an SOG film 49 is formed for flattening the surface. As seen from FIG. 6C, after the SOG film 49 has been etched back, a silicon oxide film 50 is formed so that a second interlayer insulating film 51 including three layers and having a thickness of 600 nm is formed.

Figure 7A:
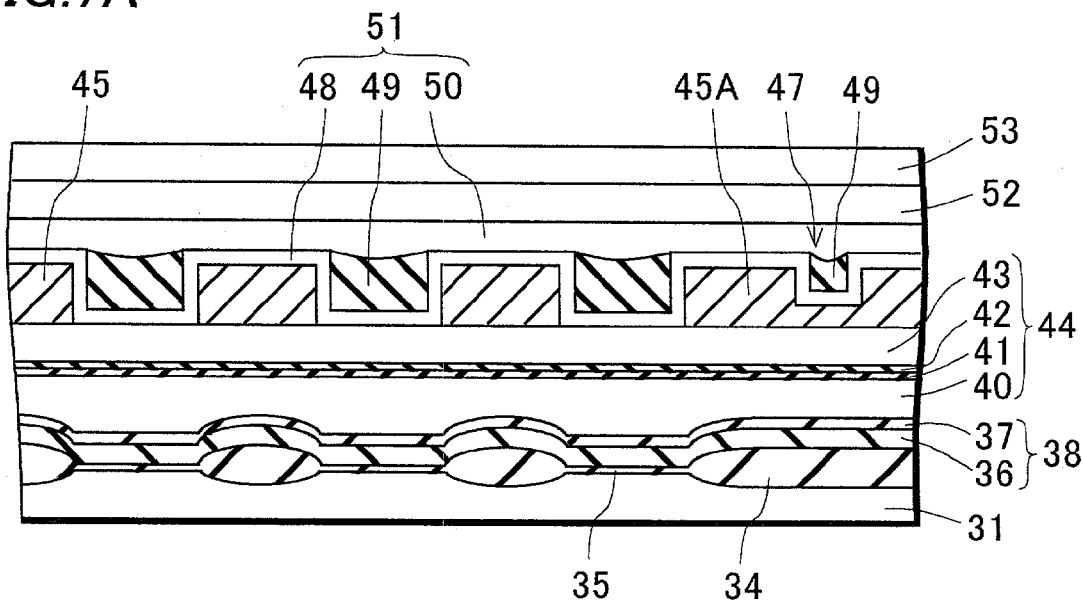
FIGS. 7A and 7B are sectional views for explaining a method of manufacturing a semiconductor device according to the second embodiment of this invention.

Step 6: As seen from FIG. 7A, a metallic film of e.g. an Al film is formed on the interlayer insulating film 51. The metallic film is patterned to form second Al wirings (not shown). A third interlayer insulating film 52 having a thickness of 600 nm is formed on the surface so as to cover the second Al wirings. A metallic film of e.g. an Al flim is formed on the third interlayer insulating film 52 is formed. The metallic film is patterned to form third Al wirings (not shown). Then, a fourth interlayer insulating film 53 having a thickness of 600 nm is formed on the surface so as to cover the third Al wirings.

Until this step, the manufacturing process can be carried out irrespectively of what program should be written in the memory cell transistors. For this reason, the wafers can be previously manufactured. In this case, in order to protect the metallic wiring layer and prevent its corrosion, a protection film of e.g. a thin silicon oxide film having a thickness of 50 nm is formed on the entire surface.

Figure 7B:
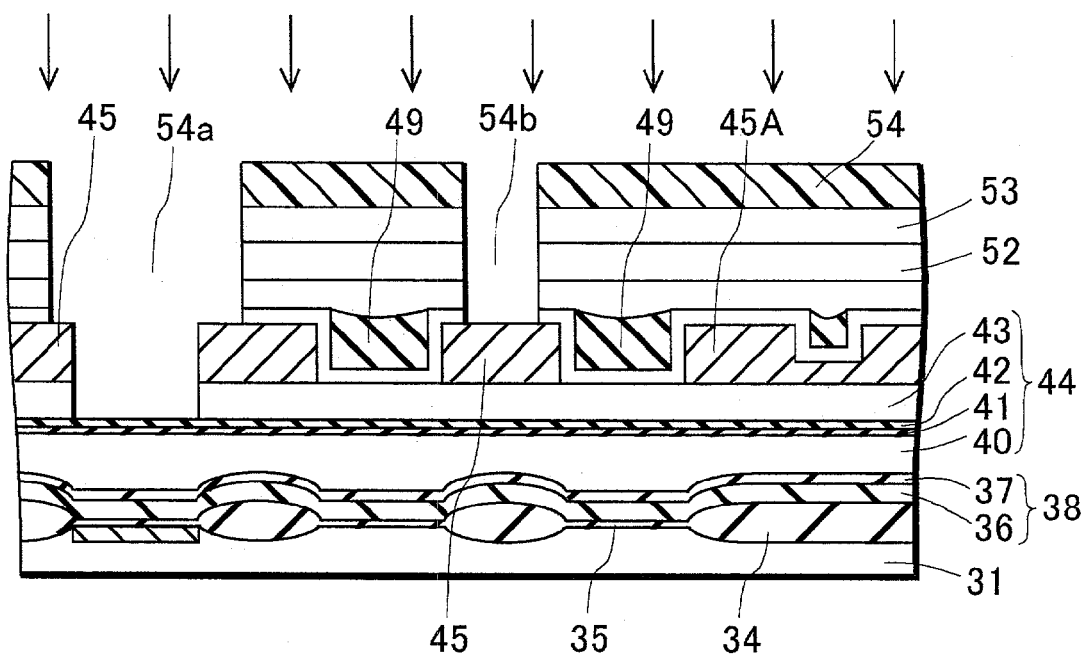

Step 7: At the time when a program to be written is determined on receipt of a request from a customer, a photoresist 54 is formed on the fourth interlayer insulating film 53 formed on the entire surface. Thereafter, using the photoresist 54 as a mask, the interlayer insulating films are etched to make an opening 54a in the region above a prescribed memory cell to be program-written and a via hole 54b to be in contact with the Al wiring 45. Incidentally, it should be noted that the etching for making the opening 54a is stopped on the poly-Si film 42 (FIG. 7B).

Step 8: As seen from FIG. 7B, P type impurities such as boron are ion-implanted in the semiconductor substrate 31 immediately beneath the gate electrode 38 from the opening 54a so that a predetermined memory cell transistor is depleted. As described above, since the edges 45a of the Al wiring 45 are located immediately above those of the element isolation film 34, using the Al wiring as a mask, the ion implantation can be carried out with great accuracy. Thus, the threshold voltage of the memory cell transistor is lowered so that a ROM data is written.

In addition, in accordance with this invention, in the write of the ROM data, since the metallic film (Al wiring 45) having higher processing accuracy than the conventional photoresist, unlike the background art, it is not necessary to give sufficient allowance in order to avoid occurrence of poor element isolation and to give the element isolation film a larger width than the processing limit. This permits microstructuring.

Since a part of the interlayer insulating film 44 as well as the interlayer insulating films 53, 52 and 51 on the Al wiring has been etched, the ion-implanting can be carried out at low energy of 130 keV to 160 keV. This prevents the lateral diffusion of implanted ions, and hence permits the ion-implanting with higher accuracy.

Step 9: Although not illustrated, a pad portion is formed through the via hole, a passivation film is formed on the entire surface. Thus, a mask ROM with a desired program written is completed.

As described above, in accordance with this invention, the groove 47 having a prescribed depth is formed in the surface of the wide Al wiring 45A. For this reason, in the manufacturing process including provision of the interlayer insulating film flattened using the SOG film, the SOG film 49 is not formed excessively thick on the wide Al wiring 45A. Owing to this, when this SOG 49 is etched back and thereafter when the interlayer insulating film is etched, an etching remainder is not provided. Thus, shortage of the opening when the interlayer insulating film is etched is suppressed so that the via hole and the opening for writing information in the ROM portion can be stably made. This stabilizes the characteristic and production yield. This also improves the uniformity in flattening the wafer surface.

Embodiment 3

Referring to the drawing, an explanation will be given of a third embodiment of this invention. The same manufacturing process as the second embodiment will be explained with reference to the drawings used for explaining the second embodiment.

Figure 5C:
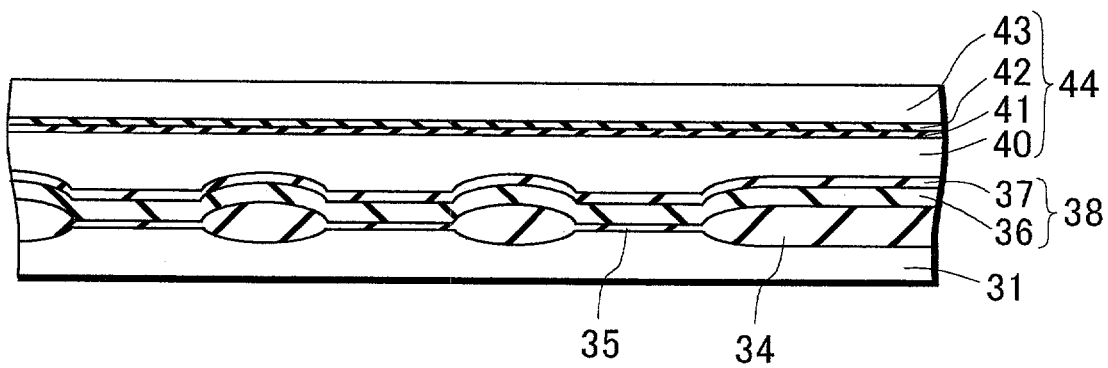
Figure 8A:
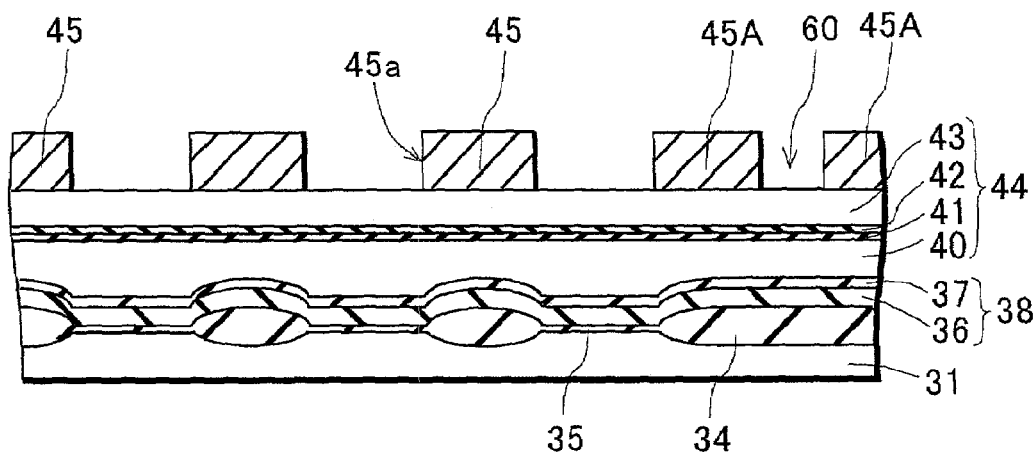
FIGS. 8A and 8B are sectional views for explaining a method of manufacturing a semiconductor device according to a third embodiment of this invention.
Figure 8B:
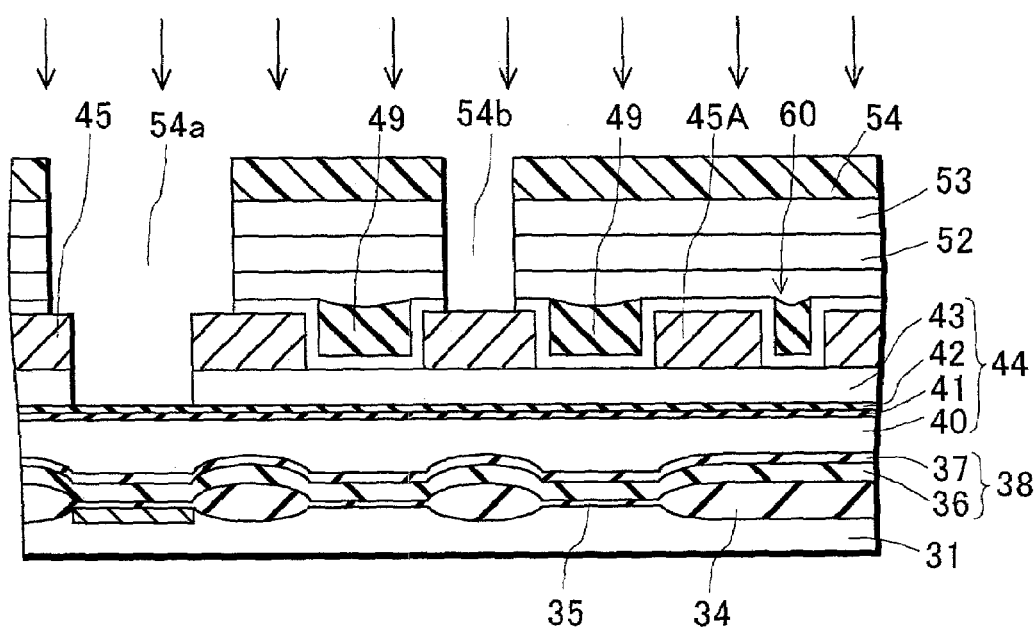
Figure 10:
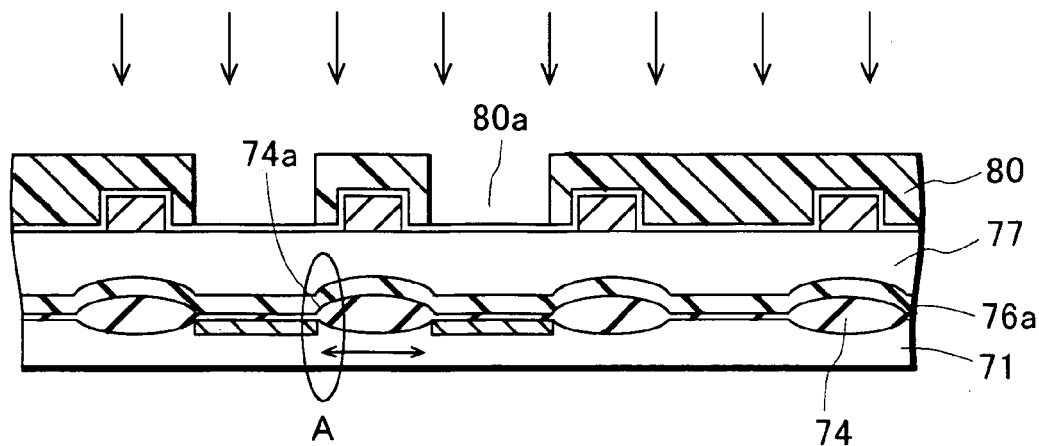
FIG. 10 is a sectional view for explaining a method of manufacturing the semiconductor device.

The feature of the third embodiment resides in that after the step shown in FIG. 5C (step of forming the interlayer insulating film 44), as seen from FIG. 8A, the first Al wirings 45 are formed on the interlayer insulating film 44 and slits are formed at regular intervals in the wide Al wiring 45A.

In this way, since the slits 60 are formed at regular intervals in the wide Al wiring 45A, the SOG film 49 which constitutes the interlayer insulating film 51 is embedded in the slits, and hence is not formed excessively thick on the periphery of the wide Al wiring 45A like the above the second embodiment.

In this embodiment also, shortage of the opening when the interlayer insulating film is etched is suppressed so that the via hole and the opening for writing information in the ROM portion can be stably made. This stabilizes the characteristic and production yield. This also improves the uniformity in flattening the wafer surface.

Further, in this embodiment, unlike the second embodiment, after the Al wiring 45A has been formed, the groove(s) 47 is not formed by an individual step in the Al wiring 45A. Instead of this, the slits 60 are formed when the Al wirings 45 and 45A are patterned. For this reason, the number of manufacturing steps is not increased.

The technical idea of this invention can be easily applied to the case where a larger number of layers of the metallic wiring is formed.

Further, in the step 3 of each embodiment, the gate electrode can be formed in any manner of forming a poly-Si film, patterning the poly-Si, and forming a silicide film on the poly-Si film.

Further, in each of the embodiments, although the P-type semiconductor substrate was used, an N-type semiconductor substrate or a well region on the semiconductor substrate may be used.

Moreover, in each of the embodiments described above, the program was written in a manner of a depletion ion-implanting of lowering the threshold voltage, but can be also written in a manner of boosting the threshold value.

Further, the application filed of this invention should not be limited to the method of writing a program in the mask ROM. This invention can be applied to various products which experience the step of implanting impurity ions using a photoresist as a mask, or using the photoresist and a metallic wiring as the mask.

In accordance with this invention, the protection film is formed on the metallic wiring, when the interlayer insulating films are etched using the metallic wiring as a mask. For this reason, the metallic wiring is not etched and hence no deposit is formed on the side wall of the opening. Thus, the coverage when the passivation film is formed is improved and hence the reliability of the device is also improved.

Further, in accordance with this invention, the groove or slit is formed in the surface of the wide metallic wiring. For this reason, the film for flattening which constitutes the interlayer insulating film is embedded in the groove or slits, and hence the film for flattening is not deposited excessively thick. Thus, it is possible to prevent the characteristic deterioration and reduction of the production yield owing the etching remainder.

What is claimed is:

1. A semiconductor device comprising:
   a gate electrode on a gate insulated film, which is on a semiconductor substrate;
   source/drain regions adjacent to said gate electrode;
   an interlayer insulating film formed over the gate electrode and the source/drain regions,
   a metallic wiring formed on the interlayer insulating film to cover said gate electrode,
   an etch-protection film in contact with selected portions of said metallic wiring, wherein impurities ions are implanted into a surface of said semiconductor substrate with the interlayer insulating film being partially etched by using said metallic wiring and a photoresist formed thereon as a mask.

2. The semiconductor device according to claim 1, wherein said etch-protection film is formed over the metallic wiring before etching said interlayer insulating film.

3. The semiconductor device according to claim 1, wherein said etch-protection film comprises one of a titanium film and a laminated film including the titanium film and a titanium nitride film.

4. The semiconductor device of claim 1, wherein said interlayer insulating film comprises layers of a first silicon oxide film, a silicon nitride film, a poly-Si film and a second silicon oxide film.

* * * * *